(12) United States Patent
Fontanesi et al.

(10) Patent No.: US 11,262,418 B2
(45) Date of Patent: Mar. 1, 2022

(54) APPARATUSES AND METHODS FOR SENDING AND RECEIVING ROTATION SPEED INFORMATION

(71) Applicant: Infineon Technologies AG, Neubiberg (DE)

(72) Inventors: Simone Fontanesi, Villach (AT); Patricia Lorber, Ossiach (AT); Tobias Werth, Villach (AT)

(73) Assignee: Infineon Technologies AG, Neubiberg (DE)

( * ) Notice: Subject to any disclaimer, the term of this patent is extended or adjusted under 35 U.S.C. 154(b) by 221 days.

(21) Appl. No.: 16/564,162

(22) Filed: Sep. 9, 2019

(65) Prior Publication Data
US 2020/0081074 A1    Mar. 12, 2020

(30) Foreign Application Priority Data
Sep. 10, 2018   (DE) .......................... 102018121998.9

(51) Int. Cl.
| | | |
|---|---|---|
| *G01R 33/00* | (2006.01) | |
| *G01D 5/14* | (2006.01) | |
| *G01D 5/244* | (2006.01) | |
| *G01P 3/487* | (2006.01) | |
| *G01P 3/489* | (2006.01) | |

(Continued)

(52) U.S. Cl.
CPC .......... *G01R 33/0094* (2013.01); *B60T 8/885* (2013.01); *G01D 5/145* (2013.01); *G01D 5/2451* (2013.01); *G01D 5/24466* (2013.01); *G01P 3/487* (2013.01); *G01P 3/489* (2013.01); *B60T 2270/416* (2013.01)

(58) Field of Classification Search
CPC ....... G01P 3/489; G01D 5/2451; G01D 5/145
See application file for complete search history.

(56) References Cited

U.S. PATENT DOCUMENTS

| | | | |
|---|---|---|---|
| 9,008,217 B2* | 4/2015 | Heim ..................... | G01P 3/489 375/295 |
| 2014/0210641 A1* | 7/2014 | Hammerschmidt .... | G01P 3/489 340/870.19 |
| 2016/0231141 A1 | 8/2016 | Endres et al. | |

(Continued)

FOREIGN PATENT DOCUMENTS

| | | |
|---|---|---|
| CN | 105745127 A | 7/2016 |
| CN | 107850618 A | 3/2018 |

(Continued)

OTHER PUBLICATIONS

German Patent Office, Office Action issued for DE 102018121998.9, 12 pgs., dated May 13, 2019.

(Continued)

*Primary Examiner* — Reena Aurora
(74) *Attorney, Agent, or Firm* — Schiff Hardin LLP

(57) ABSTRACT

Apparatuses and methods for sending and receiving rotation speed information and corresponding computer programs and electronically readable data carriers are provided. A current interface is configured to transmit pulse sequences coding a number of bits. In a first bit group of the number of bits, it is flagged whether the pulse sequence has been sent for a zero crossing in a magnetic field. Information modulated onto a second bit group of the number of bits is selected on the basis of the first bit group.

23 Claims, 4 Drawing Sheets

(51) Int. Cl.
*B60T 8/88* (2006.01)
*G01D 5/245* (2006.01)

(56) References Cited

U.S. PATENT DOCUMENTS

2017/0160303 A1   6/2017  Jockel et al.
2018/0210004 A1*  7/2018  Tepass .................... G01P 3/489
2019/0011292 A1*  1/2019  Hainz .................... G01D 5/249

FOREIGN PATENT DOCUMENTS

| | | |
|---|---|---|
| DE | 102014100994 A1 | 7/2014 |
| KR | 10-2018-0031682 A | 3/2018 |
| WO | WO-02/003079 A1 | 1/2002 |
| WO | WO-02/090999 A1 | 11/2002 |
| WO | WO-2017/012744 A1 | 1/2017 |

OTHER PUBLICATIONS

Office Action dated Jun. 2, 2021 for Chinese Patent Application No. 20191765179.2.

* cited by examiner

Figure 6:

| Bit number | Information content | Abbreviation | Coding |
|---|---|---|---|
| 0 | Air gap reserve | LR | 1 if air gap reserve reached |
| 1 | Zero crossing | ZC | 1 if zero crossing, 0 if further pulse sequence |
| 2 | Low speed | LS | 1 if $f_{enc} < f_{activation}$ |
| 3 | Direction valid | GDR | 1 if direction of rotation valid |
| 4 | Direction | DR | 0 if direction of rotation positive |
| 5 | Phase information/LM bits | A0/LM0 | LM bits for zero crossing, phase information for further point |
| 6 | Phase information/LM bits | A1/LM1 | LM bits for zero crossing, phase information for further point |
| 7 | Phase information/LM bits | A2/LM2 | LM bits for zero crossing, phase information for further point |
| 8 | Parity | P | 1 if parity, incl. parity bit, even |

Figure 7:

| Bit number | Information content | Abbreviation | Coding |
|---|---|---|---|
| 0 | Error bit | ERR | 1 if there is an error |
| 1 | Zero crossing | ZC | 1 if zero crossing, 0 if further pulse sequence |
| 2 | Low speed | LS | 1 if $f_{enc} < f_{activation}$ |
| 3 | Direction valid | GDR | 1 if direction of rotation valid |
| 4 | Direction | DR | 0 if direction of rotation positive |
| 5 | Phase information/LM bits/error bits | A0/LM0/ERR0 | LM bits or error bits for zero crossing, phase information for further point |
| 6 | Phase information/LM bits/error bits | A1/LM1/ERR1 | LM bits or error bits for zero crossing, phase information for further point |
| 7 | Phase information/LM bits/error bits | A2/LM2/ERR2 | LM bits or error bits for zero crossing, phase information for further point |
| 8 | Parity | P | 1 if parity, incl. parity bit, even |

APPARATUSES AND METHODS FOR SENDING AND RECEIVING ROTATION SPEED INFORMATION

TECHNICAL FIELD

The present application relates to apparatuses and methods for sending and receiving rotation speed information and to corresponding computer programs and data carriers.

BACKGROUND

In vehicle engineering, for example in automobile construction, sensors are used in order to ascertain rotation speeds of vehicle tires. These rotation speeds are then used in some cases for safety-relevant systems, such as for example antilock braking systems, or else for controlling other components of a drive train of the vehicle. Usually, this involves ascertaining information concerning the rotation speed of the wheel by means of a magnetic signal transmitter connected to the wheel so as to resist rotation and a magnetic field sensor at a fixed location that detects the magnetic field generated by the signal transmitter. In this case, the signal transmitter can be for example a ferromagnetic gearwheel or a rotor having multiple magnet elements, such as permanent magnets, in an evenly distributed arrangement over the circumference of said rotor that have an alternating magnetic orientation. When the signal transmitter rotates together with the wheel, the generated magnetic field changes, and these changes are measured by the magnetic field sensor. Such a magnetic field sensor can have one or more individual sensor elements in this case.

The measured magnetic field is then used to produce information that is transmitted to a control unit of the vehicle. This is accomplished in many cases by using what is known as the AK protocol. Conventionally, the AK protocol involves each zero crossing that the magnetic field sensor detects in the magnetic field resulting in a pulse being generated, also referred to as a speed pulse. Following this pulse, further information, such as for example error information, information concerning the size of an air gap between the sensor and the signal transmitter, direction of rotation information and the like, can be transmitted.

In particular at low rotation speeds, such as for example occur during parking maneuvers, the interval between the zero crossings can be relatively large. Owing to this large interval, it may not be possible for the position of the vehicle to be ascertained precisely enough for the parking maneuver on the basis of the rotation speed. Therefore, higher-resolution rotation speed information would be desirable in such cases.

A higher resolution of this kind can fundamentally be achieved by virtue of not only zero crossings but also of other points in the magnetic field being detected and used for outputting information to the control unit. With present implementations of the AK protocol, however, it can be difficult to transmit higher-resolution information of this kind, wherein other information, such as error information or information concerning a magnetic field strength, should continue to be transmittable as far as possible.

SUMMARY

An apparatus and a method are provided. The subclaims define further embodiments and also a computer program and a corresponding data carrier.

According to one exemplary embodiment, an apparatus for sending rotation speed information is provided, comprising:

a signal processing device for receiving a magnetic field sensor signal, and a current interface for sending pulse sequences of a current signal, wherein each pulse sequence comprises a first pulse having a first current level, followed by a number of bit pulses coding a number of bits having a second and a third current level, wherein the signal processing device is configured to detect zero crossings in a characteristic of a magnetic field and further points in a characteristic of the magnetic field on the basis of the magnetic field sensor signal, and to actuate the current interface to send a pulse sequence when a zero crossing or a further point in the magnetic field is detected, wherein, in a first bit group of the number of bits of a respective pulse sequence, it is flagged whether the pulse sequence is a pulse sequence sent for a detected zero crossing or a pulse sequence sent for a detected further point, and, depending on whether it is a pulse sequence sent for a detected zero crossing or a pulse sequence sent for a detected further point, information modulated onto a second bit group of the number of bits of the respective pulse sequence is selected.

According to a further exemplary embodiment, an apparatus for receiving rotation speed information is provided, comprising:

a current interface for receiving pulse sequences of a current signal, wherein each pulse sequence comprises a first pulse having a first current level, followed by a number of bit pulses coding a number of bits having a second and a third current level, and a signal processing device for processing the received pulse sequences, wherein the signal processing device is configured to use a first bit group of the number of bits of a respective pulse sequence in which it is flagged whether the pulse sequence is a pulse sequence sent for a detected zero crossing in a magnetic field or a pulse sequence sent for a detected further point in a magnetic field to determine what type of information is modulated on a second bit group of the number of bits, and to evaluate the second bit group in accordance with the determined type of information.

According to a further exemplary embodiment, a method for sending rotation speed information is provided, comprising:

detecting zero crossings and further points in a magnetic field, sending a respective pulse sequence for the detected zero crossings and the further points in the magnetic field, wherein each pulse sequence comprises a first pulse having a first current level, followed by a number of bits coded with a second and a third current level, and wherein, in a first bit group of the number of bits of a respective pulse sequence, it is flagged whether the pulse sequence is a pulse sequence sent for a detected zero crossing or a pulse sequence sent for a detected further point, and, depending on whether the pulse sequence is a pulse sequence sent for a detected zero crossing or a pulse sequence sent for a detected further point, information modulated onto a second bit group of the number of bits is selected.

According to a further exemplary embodiment, a method for receiving rotation speed information is provided, comprising:

receiving pulse sequences, wherein each pulse sequence comprises a first pulse having a first current level, followed by a number of bits coded with a second and a third current level, wherein a first bit group of the number of bits of a respective pulse sequence indicates whether the pulse sequence is a pulse sequence sent for a detected zero crossing or a pulse sequence sent for a detected further value in a magnetic field, determining a type of information modulated onto a second bit group of the number of bits of the respective pulse sequence on the basis of the first bit group, and evaluating the information modulated onto the second bit group in accordance with the determined type of information.

The summary above provides only a brief overview of some exemplary embodiments and is not intended to be interpreted as limiting.

BRIEF DESCRIPTION OF THE DRAWINGS

FIG. 6 is a table to illustrate a protocol according to one exemplary embodiment.

FIG. 7 is a table to illustrate a protocol according to a further exemplary embodiment.

DETAILED DESCRIPTION

Various exemplary embodiments are explained in detail below. These exemplary embodiments are used for the purposes of illustration and are not intended to be interpreted as limiting. Features of different exemplary embodiments can be combined to obtain further exemplary embodiments. Variations and modifications described for one of the exemplary embodiments are also applicable to other exemplary embodiments and are thus not explained repeatedly.

Even if rotation speed sensors for motor vehicles, in particular wheel speed sensors, are explained as examples below, the exemplary embodiments depicted are usable generally for applications in which information concerning a rotation speed is measured and transmitted to another unit.

Within the scope of this application, the term "magnetic field sensor" denotes a device that can be used to detect a magnetic field. Such a magnetic field sensor can comprise a single sensor element or else multiple sensor elements, wherein each sensor element is used to detect at least one magnetic field component, i.e. a magnetic field in one particular direction or in one plane, at the location of the respective sensor element. Sensor elements can be Hall sensor elements or magnetoresistive sensor elements, also referred to as XMR elements.

Within the scope of this application, a sensor apparatus denotes an apparatus that comprises a magnetic field sensor and further components for processing signals of the sensor and for sending information based on the signals of the sensor.

Figure 1:
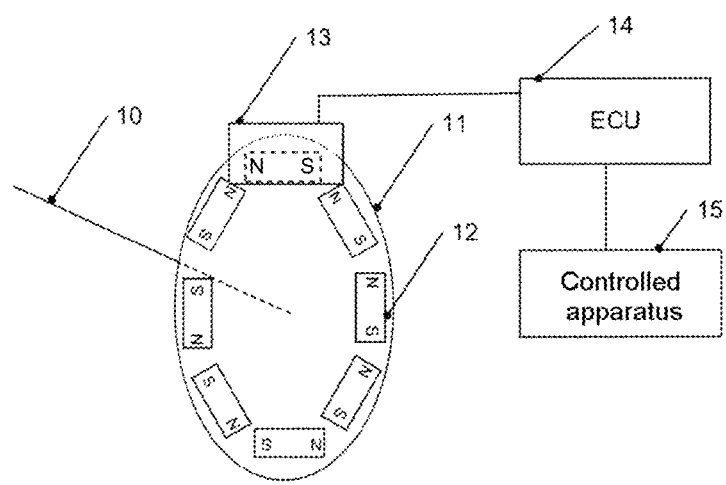
FIG. 1 is a schematic depiction of a system according to an exemplary embodiment.

FIG. 1 shows a system according to an exemplary embodiment. The system of FIG. 1 comprises a rotor 11 coupled to an axis of rotation 10. The axis of rotation 10 can be for example an axis of rotation of a vehicle tire in order to measure the rotation speed of the vehicle tire. In other exemplary embodiments, the axis of rotation 10 can be coupled to other components whose rotation speed needs to be measured, for example to other automobile components, such as gear shafts or engine components or else a steering wheel, or else components outside automobile applications. Instead of the rotor 11, it is also possible for another signal transmitter producing a time-variant characteristic of a magnetic field in the event of a rotational movement to be used, for example a ferromagnetic gearwheel.

Arranged adjacently to the rotor 11 is a sensor apparatus 13 according to one exemplary embodiment. The sensor apparatus 13 comprises a magnetic field sensor having one or more sensor elements in order to measure the magnetic field generated by the rotor 11, and also further components in order to send rotation speed information to a control unit 14 (ECU, electronic control unit). In this case, the sensor apparatus 13 is configured to send the rotation speed information according to a modified AK protocol according to exemplary embodiments. This modified AK protocol is explained in detail later. Accordingly, the control unit 14 is configured to receive and evaluate the information based on this modified AK protocol. Depending on the received information, the control unit 14 can then actuate a controlled apparatus 15. By way of example, the rotation speed information can be used to control brakes in order to implement an antilock braking system (ABS).

Apart from using the modified AK protocol, the sensor apparatus 13 and the control unit 14 can be implemented in any conventional manner known to a person skilled in the art. The design of such sensor apparatuses and control units using a modified AK protocol of this kind is explained even more specifically below with reference to FIG. 2.

Figure 2:
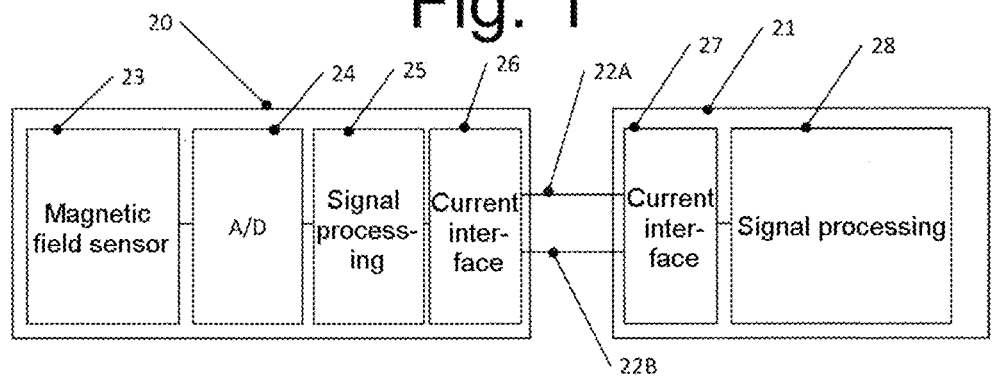
FIG. 2 is a block diagram of a system according to an exemplary embodiment.

FIG. 2 shows a block diagram of a sensor apparatus 20 and a control unit 21, which can be an example of the sensor apparatus 13 and the control unit 14 of FIG. 1, but are also usable in exemplary embodiments other than in the exemplary embodiment of FIG. 1.

The sensor apparatus 20 comprises a magnetic field sensor 23, which can have one or more sensor elements as described. An output from the magnetic field sensor 23 is supplied to an analog-to-digital converter 24 for analog-to-digital conversion. The sensor output thus digitized is then digitally processed in a signal processing device 25. The signal processing device 25 can be realized by means of one or more digital signal processors, other appropriately programmed processors or else by means of specific hardware, such as application specific integrated circuits (ASICs) or field programmable gate arrays (FPGAs). In the signal processing 25, it is possible by way of example for zero crossings in a magnetic field detected by the sensor 23 or other specific points in the characteristic of the (time-variant) magnetic field to be detected, for a strength of the magnetic field to be detected or else for error monitoring to be performed. A point in the magnetic field or a point in the characteristic of the magnetic field is intended to be understood in this case to mean a time at which the magnetic field has a prescribed property, e.g. a prescribed value, has a (global) minimum or a (global) maximum, or has a particular phase angle. This is explained even more specifically later on with reference to FIG. 4.

The signal processing 25 then actuates a current interface 26 in order to transmit information via lines 22A, 22B. In this case, the information is coded according to a modified AK protocol according to exemplary embodiments on the basis of current levels. The current on the lines 22A, 22B can additionally be used in this case to supply the sensor apparatus 20 with current. Apart from using the modified AK protocol, as described later, the sensor apparatus 20 and the components thereof can be implemented in any conventional manner. In other words, in particular the signal processing 25 is configured to actuate the current interface 26 to transmit information according to the modified AK protocol, and can otherwise process the information of the digital sensor output in a conventional manner. The signal processing 25 and the current interface 26 in this case form an apparatus for sending rotation speed information according to an exemplary embodiment.

At the control unit 21 end, a current interface 27 receives the sent information and passes the sent information to a signal processing device 28. In one exemplary embodiment, the signal processing device 28 interprets the received information according to the modified AK protocol. Apart from using the modified AK protocol, the current interface 27 and the signal processing 28 can be implemented in any conventional manner. Like the signal processing device 25, the signal processing device 28 can also be implemented for example by means of a digital signal processor, an appropriately programmed general processor and/or by means of specific hardware.

Various exemplary embodiments of a modified AK protocol usable in the systems of FIGS. 1 and 2 are explained below.

Figure 3:
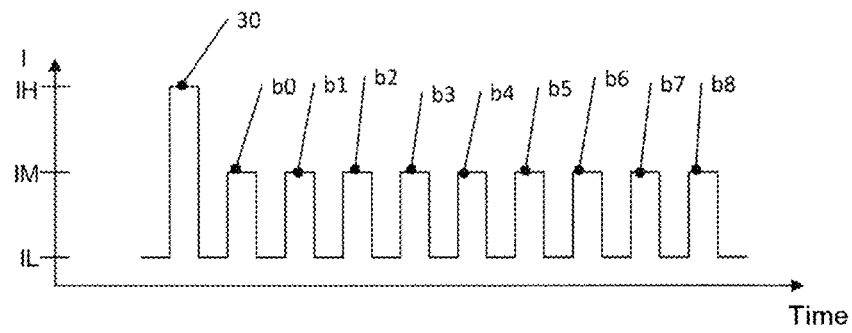
FIG. 3 illustrates a pulse sequence as used in exemplary embodiments.

Like the conventional AK protocol, the modified AK protocol according to various exemplary embodiments also uses pulse sequences consisting of a speed pulse, followed by a number of information bits, in particular nine information bits. In this case, in some implementations, the information bits are represented as bit pulses b0, b1, ..., b8. An example of a pulse sequence comprising speed pulse and bit pulses is depicted in FIG. 3. The pulse sequence uses three current levels, a high current level IH, a medium current level IM and a low current level IL. IH can be approximately 28 mA, IM can be approximately 14 mA and IL can be approximately 7 mA, for example. Each pulse sequence has a speed pulse 30 having a high current level IH. Following the speed pulse 30, which is sometimes also referred to as a synchronization pulse, nine bits b0 to b8 are coded by means of the current levels IM, IL in applicable bit pulses. These bit pulses are depicted only schematically in FIG. 3. By way of example, a logic 1 of bits b0 to b8 can be coded by means of a transition from IL to IM and a logic 0 can be coded by means of a transition from IM to IL. In other exemplary embodiments, a logic 1 can be coded by means of the current level IM and a logic 0 can be coded by means of the current level IL. In this respect, the pulse sequence of FIG. 3 is consistent with the conventional AK protocol.

In contrast to the conventional AK protocol, the pulse sequence of FIG. 3 is sent not only for zero crossings in the magnetic field, but also, at least in one mode of operation, for other points in the magnetic field, in order to increase the resolution, because there are then more than two measurement times available over one period of the time-variant magnetic field. This at least one mode of operation can be a mode of operation at low rotation speeds, for example rotation speeds below a prescribed threshold value.

In this case, in the at least one mode of operation, one bit of a first bit group is used to indicate whether the pulse sequence is a pulse sequence for a zero crossing or a pulse sequence for another point in the magnetic field. Additionally, in some exemplary embodiments, the first bit group can also contain an error bit. A bit group for the purposes of the present application can comprise one bit or else multiple bits. In addition, the modified AK protocol according to some exemplary embodiments results in various information being modulated onto bits of a second bit group in accordance with values of bits of the first bit group, i.e. on the basis of whether the pulse sequence is sent for a zero crossing or for another value and possibly on the basis of whether an error has occurred. As such, pulse sequences generated for a zero crossing in the magnetic field can result for example in information that indicates a strength of the magnetic field being modulated onto the bits of the second bit group. The strength of the magnetic field in this case correlates with an air gap between the magnetic field sensor and the signal transmitter. In the case of a pulse sequence sent for a further point in the magnetic field, phase information indicating that point in the magnetic field for which the pulse group has been sent can be modulated onto the second bit group. The information concerning the point in the magnetic field at which the pulse sequence is used is referred to generally as phase information within the scope of this application, and it can code the point or a phase angle that the point is at, for example. Moreover, in some exemplary embodiments, when the first bit group has a bit indicating an error, it is possible for an error code to be modulated onto the second bit group in the case of an error. Examples of this are explained even more specifically later with reference to FIGS. 6 and 7.

Figure 4:
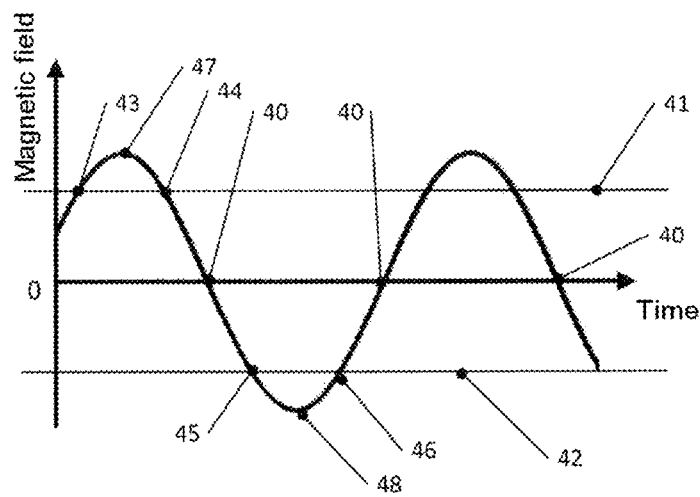
FIG. 4 illustrates the provision of high-resolution rotation speed information based on a measured magnetic field.

FIG. 4 schematically shows a sinusoidal characteristic of a measured magnetic field over time to explain zero crossings and further points in the characteristic of the magnetic field. A sinusoidal characteristic of this kind arises for example at least approximately in the case of the sensor apparatus 13 when the rotor 11 of FIG. 1 rotates. This magnetic field is detected by a magnetic field sensor, such as the sensor 23 of FIG. 2, digitized, and processed by a signal processing device, such as the signal processing device 25. In particular zero crossings 40 in the magnetic field are detected in this case. For every detected zero crossing, it is then possible for a pulse sequence, as depicted in FIG. 3, to be sent.

Moreover, at least in one mode of operation, for example at a rotation speed below a prescribed threshold value, further points in the characteristic of the magnetic field can be detected, and pulse sequences can be sent at said points. By way of example, a pulse sequence can be sent when the magnetic field crosses a positive threshold value 41 at 43 or 44 in FIG. 4 (from low to high magnetic field strengths at 43 and from high to low magnetic field strengths at 44), or crosses a negative threshold value 42 at 45 or 46. Additionally or alternatively, global maxima 47 or global minima 48 in the characteristic of the magnetic field can be detected. In other exemplary embodiments, the reaching of particular phase angles of the sinusoidal characteristic, e.g. 30°, 60°, etc., can be detected.

In some exemplary embodiments, further points can also be detected by using multiple sensor elements. As such, sensor signals of multiple sensor elements arranged along the rotor can be used to determine an instantaneous phase angle of the magnetic field in a manner known per se, with use being made of the fact that the multiple sensor elements "see" the characteristic of the magnetic field in a manner staggered over time with respect to one another.

At these detected further points 43 to 48, it is then likewise possible for a pulse sequence, as shown in FIG. 3, to be sent. As already explained with reference to FIG. 3, a bit of a first bit group in this case indicates whether the pulse sequence is a pulse sequence sent for a detected zero crossing 40 or a pulse sequence sent for a detected further point 43 to 48.

In the case of a pulse sequence detected for a zero crossing, it is then possible for information, for example information concerning the strength of the magnetic field, to be modulated onto the second bit group, whereas in the case of a pulse sequence detected for one of the further points, phase information indicating that one of the further points 43 to 48 for which the respective pulse sequence has been sent is modulated on.

To this end, for example each point 43 to 48 can be assigned a specific bit code that is then modulated onto the second bit group.

As already mentioned, in some exemplary embodiments, the first bit group can additionally contain an error bit indicating an error. When an error is indicated, it is also possible for an error code to be modulated onto the second bit group. This is explained even more specifically later with reference to FIG. 7.

Figure 5:
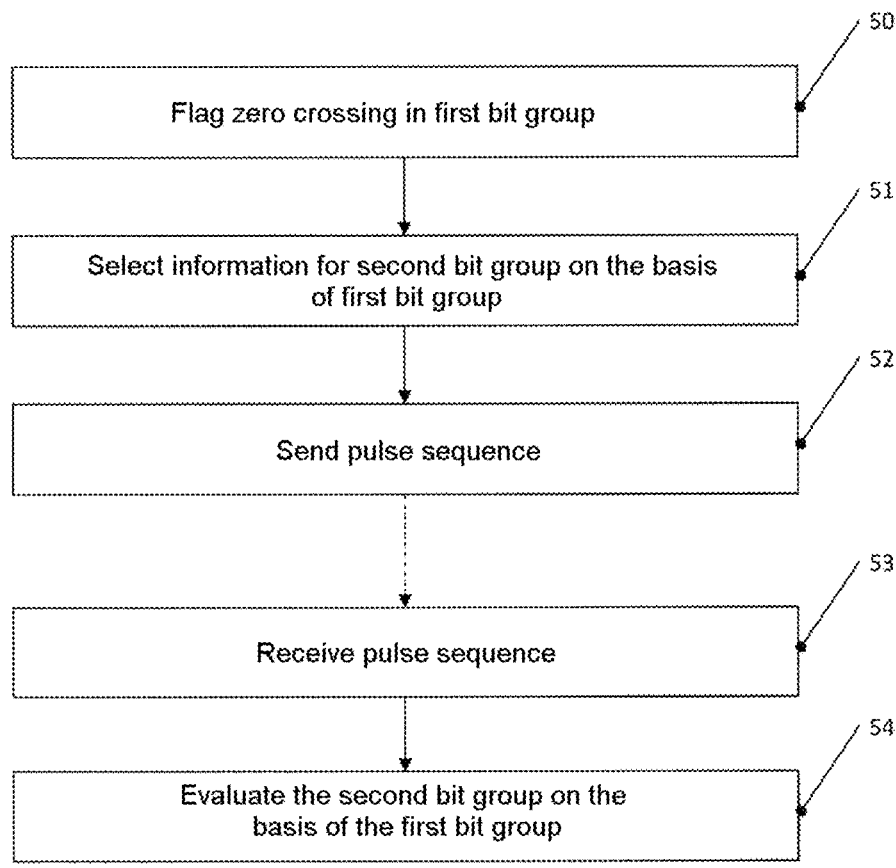
FIG. 5 in a flowchart to illustrate a method according to an exemplary embodiment.

FIG. 5 shows a flowchart to illustrate a method according to an exemplary embodiment that uses the approaches explained above. The method can be carried out in the system of FIG. 1 or the system of FIG. 2, for example, but is not limited thereto. As likewise already mentioned, the method can be performed in particular in a mode of operation in which a rotation speed, for example wheel speed, is below a prescribed threshold value. At higher rotation speeds, the communication can then be effected in the conventional manner, in particular according to conventional implementations of the AK protocol. In other exemplary embodiments, the communication can be effected independently of the rotation speed according to the methods of FIG. 5.

At 50 in FIG. 5, in a first bit group of a pulse sequence coding a multiplicity of bits, such as the pulse sequence depicted in FIG. 3, it is flagged whether the pulse sequence is a pulse sequence that is sent for a detected zero crossing (that is to say for example for the zero crossings 40 of FIG. 4) or a pulse sequence that is sent for further points in a magnetic field (for example for the points 43 to 48 of FIG. 4).

At 51, information that is modulated onto a second bit group is then selected in accordance with the first bit group. In the case of a pulse sequence sent for a zero crossing, this information can be for example information concerning the strength of the magnetic field, whereas the information can otherwise be phase information flagging that detected further point in the detected magnetic field at which the pulse sequence is sent. If the first bit group also indicates an error, the information sent can also be an error code. At 52, the pulse sequence comprising the first bit group and the second bit group is then sent.

At the receiver end, for example in the control unit of FIG. 1 or the control unit 21 of FIG. 2, the pulse sequence is then received at 53, and the second bit group is evaluated on the basis of the first bit group at 54. In other words, the first bit group indicates what type of information the second bit group contains, and a second bit group is interpreted accordingly, for example as information concerning the strength of the magnetic field, as phase information or as an error code. The type of information also indicates what a value coded in the second bit group indicates, e.g. a strength of the magnetic field, phase information or an error code.

Exemplary embodiments of this kind can be used, in particular even when short bit sequences are used, such as the 9-bit sequence of the pulse sequence of FIG. 3, to send both information concerning the phase for the increase in resolution and, as previously, conventional information, such as information concerning the size of the air gap and/or error information, e.g. an error code.

FIGS. 6 and 7 show two exemplary embodiments of a modified AK protocol in the form of tables indicating what information is modulated onto which bit of the 9-bit sequence of the pulse sequence of FIG. 3. The protocols of FIGS. 6 and 7 in this case are modifications of the conventional AK protocol, in particular in the case of FIG. 6 of what is known as the AK-LR protocol, in which a bit of the pulse sequence indicates whether an air gap reserve has been reached. In this case, the protocol of FIG. 6 is a protocol without error information, whereas the protocol of FIG. 7 is a protocol with transmission of an error code in the case of an error.

In FIGS. 6 and 7, the first column (as seen from the left) indicates the number of the bit (0 to 8), the second column indicates what information is modulated onto the respective bit, the third column indicates an abbreviation for the respective information and the fourth column indicates what value is assigned to the bit, in particular in the case in which the modified AK protocol is used, for example as discussed in a mode of operation in which a rotation speed is below a threshold value. In other cases, bits can be used as in the case of a conventional AK protocol.

In FIG. 6, bit 0, i.e. the first bit, indicates whether what is known as an air gap reserve has been reached, i.e. whether the magnetic field strength is sufficient for a correct measurement. If this air gap reserve is reached, bit 0 is assigned the value 1. It should be noted that this value and other values are used only as an example and for example an inverse coding (use of the value 0 instead of the value 1, and vice versa) is also possible. The use of bit 0 as chosen in FIG. 6 is consistent with a conventional use of bit 0.

Bit 1 (the second bit) is modulated with the information concerning whether the pulse sequence is a pulse sequence sent for a zero crossing (points 40 in FIG. 4) or a pulse sequence sent at another point (for example points 43 to 48 of FIG. 4). In the example of FIG. 6, bit 1 is assigned the value 1 if the pulse sequence is a pulse sequence sent for a zero crossing, and is assigned the value 0 if the pulse signal is a pulse sequence sent at another point to increase the resolution. Bit 1 in the exemplary embodiment of FIG. 6 forms the aforementioned first bit group, i.e. the latter consists of only one bit in this case.

Bit 2 indicates whether there is a low rotation speed, in which case the modified AK protocol is used. In the exemplary embodiment of FIG. 6, bit 2 is assigned the value 1 when a frequency of zero crossing pulses $f_{enc}$ is below a threshold value $f_{activation}$.

Bit 3 indicates whether a direction of rotation is valid, i.e. has been detected correctly, and is set to 1 in the case of a valid direction of rotation. Bit 4 indicates the direction of rotation 0 when the direction of rotation is positive and 1 when the direction of rotation is negative. In some implementations, the direction of rotation can be defined on the basis of pins of a magnetic field sensor used. By way of example, a positive direction of rotation can be defined as the direction of rotation for which poles of the rotor 11 of FIG. 1 move from a VDD pin to a ground pin of the sensor when the sensor surface is facing the rotor. Other definitions are also possible. Bits 3 and 4 are consistent with the conventional use of these bits at least in some conventional AK protocols.

The information modulated onto bits 5 to 7 is dependent on whether the pulse sequence is a pulse sequence sent for a zero crossing or a pulse sequence sent for another point. In this case, bits 5 to 7 thus form the second bit group. In the exemplary embodiment of FIG. 6, bits 5 to 7 are modulated with phase information indicating the point at which the pulse sequence is sent (for example for which point 43 to 48 of FIG. 8) when bit 1 is set to 0, i.e. the pulse sequence is sent at a further point in the magnetic field. In this case, three bits 5 to 7 are referred to as A0 to A2 and code precisely the phase information to increase the resolution. By way of example, each point 43 to 48 of FIG. 4 can be assigned a 3-bit value (for example 000 for point 43, 001 for point 47, 010 for point 44, 011 for point 45, 100 for point 48 and 101 for point 46), and when the pulse sequence is sent at the applicable point the applicable bit value is modulated onto bits 5 to 7. Overall, the three bits A0 to A2 can be used to code up to eight positions. In the example of FIG. 4, only six positions are used; in other exemplary embodiments, more or fewer additional points at which pulse sequences are sent can also be defined. By way of example, eight points can be defined by virtue of the crossing of two different positive threshold values instead of only one positive threshold value 41 and two different negative threshold values instead of the negative threshold value 42 being monitored.

In the case of a pulse sent for a zero crossing (bit 1=1), bits 5 to 7 have information concerning the strength of the magnetic field, i.e. the amplitude of the magnetic field, coded onto them as bits LM0 to LM2, as in the case of some conventional implementations of the AK protocol. In this case, a value 000 can mean that the sensor is not calibrated, and otherwise the strength of the magnetic field can be coded in values from 001 to 111. As already explained, the strength of the magnetic field correlates with the size of the air gap, so that this can be used to derive information about the size of the air gap.

Bit 8 is a parity bit and can therefore be used as a check bit for the correct transmission of the pulse sequence. In the example of FIG. 6, the parity bit is set to 1 when the parity including the parity bit is even, and is set to 0 when the parity is uneven.

It should be noted that bits 1, 5, 6 and 7 are freely available in the AK protocol, which means that the protocol of FIG. 6 uses these freely usable bits to provide additional functionalities, and in particular to transmit additional information.

FIG. 7 shows a further exemplary embodiment of a protocol according to the invention that can additionally transmit error information. Bits 1 to 4 and 8 of the exemplary embodiment of FIG. 7 are consistent with bits 1 to 4 and 8 of the exemplary embodiment of FIG. 6 and are thus not explained again.

Bit 0 is an error bit in the case of FIG. 7. It is assigned the bit value 1 when there is an error and a value 0 when there is no error.

An error can be a missing measured value from the sensor, for example, or any other error also implemented by self-test apparatuses and the like in the case of conventional sensors. Examples of such errors are a drop in an external supply voltage or in an internal supply voltage of the sensor apparatus below a threshold value, an absence or frequency error of a clock signal, a detected magnetic field strength below a threshold value, saturation of an analog-to-digital converter (e.g. 24 in FIG. 2) or digital-to-analog converter, an overtemperature or a time above a threshold value during which no minima or maxima in the characteristic of the magnetic field have been detected. In some exemplary embodiments, a nonvalid direction of rotation can also be such an error, but this is handled separately by means of bit 3 in the exemplary embodiment of FIG. 7.

In the exemplary embodiment of FIG. 7, bits 0 and 1 form the first bit group, while bits 5 to 7 in turn form the second bit group. In other words, the values of bits 0 and 1 indicate what information is modulated onto bits 5 to 7.

When there is no error (bit 0=0), bits 5 to 7 in the exemplary embodiment of FIG. 7 are used as in the exemplary embodiment of FIG. 6, i.e. have bits A0 to A2 assigned to them, which indicate phase information, when bit 1=0, and have bits LM0 to LM2 assigned to them, which indicate information concerning the strength of the magnetic field, when bit 1=1 and hence the pulse sequence is sent for a zero crossing. When there is an error, i.e. bit 1=1, an exemplary embodiment in the case of bit 1=1 (pulse sequence for zero crossing) results in bits 5 to 7 being assigned a 3-bit error code ERR0 to ERR2 indicating what type of error there is, for example what type of errors described above. When bit 1=0, this exemplary embodiment, which is also depicted in FIG. 7, results in bits 5 to 7 continuing to be assigned the phase information a0 to a2.

In another exemplary embodiment, the error bit can have priority. In this case, bits 5 to 7 are always assigned the error code ERR0 to ERR2 when bit 0=1, regardless of what value bit 1 has.

The exemplary embodiments of FIGS. 6 and 7 thus allow information transmitted in a conventional AK protocol, such as the information concerning the strength of the magnetic field or an error code, to continue to be transmitted, and it is additionally possible for the resolution to be increased, to which end the applicable phase information A0 to A2 is transmitted, with the same pulse sequence format (for example the one of FIG. 3) being able to be used as in the conventional AK protocol. Therefore, the exemplary embodiments can be implemented for example by means of a modification of a firmware, i.e. the provision of an applicable computer program, for example on an applicable data carrier, without there being a need for hardware, such as for example a current interface, to be modified. This allows simple implementation of some exemplary embodiments using existing hardware.

At least some exemplary embodiments are defined in the examples that follow:

Example 1

An apparatus for sending rotation speed information, comprising:

a signal processing device for receiving a magnetic field sensor signal, and a current interface for sending pulse sequences of a current signal, wherein each pulse sequence comprises a first pulse having a first current level, followed by a number of bit pulses coding a number of bits having a second and a third current level, wherein the signal processing device is configured to detect zero crossings in a characteristic of a magnetic field and further points in the characteristic of the magnetic field on the basis of the magnetic field sensor signal, and to actuate the current interface to send a pulse sequence when a zero crossing or a further point in the magnetic field is detected, wherein, in a first bit group of the number of bits of a respective pulse sequence, it is flagged whether the pulse sequence is a pulse sequence sent for a detected zero crossing or a pulse sequence sent for a detected further point, and, depending on whether it is a pulse sequence sent for a detected zero crossing or a pulse sequence sent for a detected further point, information modulated onto a second bit group of the number of bits of the respective pulse sequence is selected. Thus, depending on whether the pulse sequence is a pulse sequence sent for a detected zero crossing or a pulse sequence sent for a detected further point, different types of information are selected for the second bit group.

Example 2

The apparatus according to example 1, wherein the number of bits of each pulse sequence is nine, wherein the second bit of the number of bits indicates whether the pulse sequence is a pulse sequence sent for a detected zero crossing.

Example 3

The apparatus according to example 2, wherein the second bit group comprises the sixth, seventh and eighth bits of the number of bits.

Example 4

The apparatus according to one of examples 1-3, wherein the further points in the magnetic field are consistent with a threshold value being crossed by the magnetic field, with a global minimum of the magnetic field and/or with a global maximum of the magnetic field.

Example 5

The apparatus according to one of examples 1-4, wherein the second bit group is modulated with phase information indicating that further point in the magnetic field for which the pulse sequence is sent when it is a pulse sequence sent for a detected further point.

Example 6

The apparatus according to one of examples 1-5, wherein, when the pulse sequence is a pulse sequence sent for a zero crossing, the second bit group is modulated with information indicating a strength of the magnetic field.

Example 7

The apparatus according to one of examples 1-4, wherein in the first bit group it is also flagged whether an error has occurred.

Example 8

The apparatus according to example 7, wherein,
when the pulse sequence is a pulse sequence sent for a zero crossing and no error has occurred, the second bit group is modulated with information indicating the strength of the magnetic field, and,
when no error has occurred, the pulse sequence is a pulse sequence sent for a further point in the magnetic field and no error has occurred, the second bit group is modulated with phase information indicating that point in the magnetic field for which the pulse sequence is sent.

Example 9

The apparatus according to example 7 or 8, wherein the second bit group is modulated with an error code as information when an error has occurred and the pulse sequence is a pulse sequence sent for a zero crossing, and the second bit group is modulated with the phase information when the pulse sequence is a pulse sequence sent for a further point in the magnetic field.

Example 10

The apparatus according to example 8, wherein when there is an error an error code is modulated onto the second bit group as information.

Example 11

An apparatus for receiving rotation speed information, comprising:
a current interface for receiving pulse sequences of a current signal, wherein each pulse sequence comprises a first pulse having a first current level, followed by a number of bit pulses coding a number of bits having a second and a third current level, and
a signal processing device for processing the received pulse sequences, wherein the signal processing device is configured to use a first bit group of the number of bits of a respective pulse sequence in which it is flagged whether the pulse sequence is a pulse sequence sent for a detected zero crossing in a characteristic of a magnetic field or a pulse sequence sent for a detected further point in a characteristic of a magnetic field to determine what type of information is modulated on a second bit group of the number of bits, and to evaluate the second bit group in accordance with the determined type of information.

Example 12

The apparatus according to example 11, wherein the signal processing device is configured to process the pulse sequences sent by the apparatus according to one of examples 1-10.

Example 13

The apparatus according to example 11 or 12, wherein the number of bits of each pulse sequence is nine, wherein the second bit of the number of bits indicates whether the pulse sequence is a pulse sequence sent for a zero crossing.

Example 14

The apparatus according to example 13, wherein the second bit group comprises the sixth, seventh and eighth bits of the number of bits.

Example 15

The apparatus according to one of examples 11-14, wherein the further point in the magnetic field is consistent with a threshold value being crossed by the magnetic field, with a global minimum of the magnetic field and/or with a global maximum of the magnetic field.

Example 16

The apparatus according to one of examples 11-15, wherein the type of information is determined as phase information indicating that detected further point in the magnetic field at which the pulse sequence has been sent when the first bit group indicates that the pulse sequence is a pulse sequence sent for a detected further point in the magnetic field.

Example 17

The apparatus according to one of examples 11-16, wherein the type of information is determined as information indicating a strength of the magnetic field when the first bit group indicates that the pulse sequence is a pulse sequence sent for a detected zero crossing.

Example 18

The apparatus according to one of examples 11-15, wherein the signal processing apparatus is also configured to use the first bit group to determine whether an error has occurred.

Example 19

The apparatus according to example 18, wherein,
when the first bit group indicates that the pulse sequence is a pulse sequence sent for a detected zero crossing and no error has occurred, the type of information is determined as information indicating the strength of the magnetic field, and,
when the first bit group indicates that no error has occurred and that the pulse sequence is a pulse sequence sent for a detected further point in the magnetic field, the type of information is determined as phase information indicating that detected point in the magnetic field in which the pulse sequence is sent.

Example 20

The apparatus according to example 18 or 19, wherein, when the first bit group indicates that there is an error, the type of information is determined as an error code when the first bit group indicates that the pulse sequence is a pulse sequence sent for a zero crossing, and the type of information is determined as the phase information when the first bit group indicates that the pulse sequence is a pulse sequence sent for a further point in the magnetic field.

Example 21

The apparatus according to example 18 or 19, wherein, when the first bit group indicates that an error has occurred, the type of information is determined as an error code.

Example 16 to 21 thus provide various opportunities for determining the type of information of example 11 on the basis of the first bit group.

Example 22

A method for sending rotation speed information, comprising:
detecting zero crossings and further points in a characteristic of a magnetic field,
sending a respective pulse sequence for the detected zero crossings and the further points in the magnetic field, wherein each pulse sequence comprises a first pulse having a first current level, followed by a number of bit pulses coding a number of bits having a second and a third current level, and wherein, in a first bit group of the number of bits of a respective pulse sequence, it is flagged whether the pulse sequence is a pulse sequence sent for a detected zero crossing or a pulse sequence sent for a detected further point, and, depending on whether the pulse sequence is a pulse sequence sent for a detected zero crossing or a pulse sequence sent for a detected further point, information modulated onto a second bit group of the number of bits is selected.

Example 23

The method according to example 22, wherein the number of bits of each pulse sequence is nine, wherein the second bit of the number of bits indicates whether the pulse sequence is a pulse sequence sent for a detected zero crossing.

Example 24

The method according to example 23, wherein the second bit group comprises the sixth, seventh and eighth bits of the number of bits.

Example 25

The method according to one of examples 22-24, wherein the further points in the magnetic field are consistent with a threshold value being crossed by the magnetic field, with a minimum of the magnetic field and/or with a maximum of the magnetic field.

Example 26

The method according to one of examples 22-25, wherein the second bit group is modulated with phase information indicating that further point in the magnetic field at which the pulse sequence is sent when the pulse sequence is not a pulse sequence sent for a detected further point.

Example 27

The method according to one of examples 22-26, wherein, when the pulse sequence is a pulse sequence sent for a zero crossing, the second bit group is modulated with information indicating a strength of the magnetic field.

Example 28

The method according to one of examples 22-25, wherein in the first bit group it is also flagged whether an error has occurred.

Example 29

The method according to example 28, wherein,
when the pulse sequence is a pulse sequence sent for a zero crossing and no error has occurred, the second bit group is modulated with information indicating the strength of the magnetic field, and,
when no error has occurred and the pulse sequence is a pulse sequence sent for a further point in the magnetic field, the second bit group is modulated with phase information indicating that detected point in the magnetic field at which the pulse sequence is sent.

Example 30

The method according to example 28 or 29, wherein the second bit group is modulated with an error code as information when there is an error, and the pulse sequence is a pulse sequence sent for a zero crossing, and the second bit group is modulated with the phase information when the pulse sequence is a pulse sequence sent for a further point in the magnetic field.

Example 31

The method according to example 28 or 29, wherein, when there is an error, an error code is modulated onto the second bit group as information.

Example 32

A method for receiving rotation speed information, comprising:
receiving pulse sequences, wherein each pulse sequence comprises a first pulse having a first current level, followed by a number of bit pulses coding a number of bits having a second and a third current level, wherein a first bit group of the number of bits of a respective pulse sequence indicates whether the pulse sequence is a pulse sequence sent for a detected zero crossing or a pulse sequence sent for a detected further value of a magnetic field,
determining a type of information modulated onto a second bit group of bits of the number of bits of the respective pulse sequence on the basis of the first bit group, and
evaluating the information modulated onto the second bit group in accordance with a determined type of information.

Example 33

The method according to example 32, wherein the method is configured to process pulse sequences sent using the method according to one of examples 22-31.

Example 34

The method according to example 32 or 33, wherein the number of bits of each pulse sequence is nine, wherein the second bit of the number of bits indicates whether the pulse sequence is a pulse sequence sent for a zero crossing.

Example 35

The method according to example 34, wherein the second bit group comprises the sixth, seventh and eighth bits of the number of bits.

Example 36

The method according to one of examples 32-35, wherein the further point in the magnetic field is consistent with a threshold value being crossed by the magnetic field, with a minimum of the magnetic field and/or with a maximum of the magnetic field.

Example 37

The method according to one of examples 32-36, wherein the type of information is determined as phase information indicating that further point in the magnetic field at which the pulse sequence has been sent when the first bit group indicates that the pulse sequence is a pulse sequence sent for a detected further point in the magnetic field.

Example 38

The method according to one of examples 32-37, wherein the type of information is determined as information indicating a strength of the magnetic field when the first bit group indicates that the pulse sequence is a pulse sequence sent for a detected zero crossing.

Example 39

The method according to one of examples 32-36, wherein the first bit group is also taken as a basis for determining whether an error has occurred.

Example 40

The method according to example 39, wherein,
when the first bit group indicates that the pulse sequence is a pulse sequence sent for a zero crossing and no error has occurred, the type of information is determined as information indicating the strength of the magnetic field, and,
when the first bit group indicates that no error has occurred and that the pulse sequence is a pulse sequence sent for a detected further point in the magnetic field, the type of information is determined as phase information indicating that detected point in the magnetic field at which the pulse sequence is sent.

Example 41

The method according to example 39 or 40, wherein,
when the first big group indicates that an error has occurred, the type of information is determined as an error code, and the type of information is determined as phase information when the first bit group indicates that the pulse sequence is a pulse sequence sent for a further point in the magnetic field.

Example 42

The method according to example 39 or 40, wherein, when the first bit group indicates that an error has occurred, the type of information is determined as an error code.
Examples 37 to 42 thus provide various opportunities for determining the type of information of example 32 on the basis of the first bit group.

Example 43

A computer program having a program code that, when inserted on a processor, causes the method according to one of examples 22 to 42 to be carried out.

Example 44

An electronically readable, tangible data carrier having the computer program according to example 43.

Example 45

An apparatus for sending rotation speed information, comprising:
means for detecting zero crossings and further points in a characteristic of a magnetic field,
means for sending a respective pulse sequence for the detected zero crossings and the further points in the magnetic field, wherein each pulse sequence comprises a first pulse having a first current level, followed by a number of bit pulses coding a number of bits having a second and a third current level, and wherein, in a first bit group of the number of bits of a respective pulse sequence, it is flagged whether the pulse sequence is a pulse sequence sent for a detected zero crossing or a pulse sequence sent for a detected further point, and, depending on whether the pulse sequence is a pulse sequence sent for a detected zero crossing or a pulse sequence sent for a detected further point, information modulated onto a second bit group of the number of bits is selected.

Example 46

The apparatus according to example 45, wherein the number of bits of each pulse sequence is nine, wherein the second bit of the number of bits indicates whether the pulse sequence is a pulse sequence sent for a detected zero crossing.

Example 47

The apparatus according to example 46, wherein the second bit group comprises the sixth, seventh and eighth bits of the number of bits.

Example 48

The apparatus according to one of examples 45-47, wherein the further points in the magnetic field are consistent with a threshold value being crossed by the magnetic field, with a minimum of the magnetic field and/or with a maximum of the magnetic field.

Example 49

The apparatus according to one of examples 45-48, wherein the second bit group is modulated with phase information indicating that further point in the magnetic field at which the pulse sequence is sent when the pulse sequence is not a pulse sequence sent for a detected further point.

Example 50

The apparatus according to one of examples 45-49, wherein when the pulse sequence is a pulse sequence sent for a zero crossing, the second bit group is modulated with information indicating a strength of the magnetic field.

Example 51

The apparatus according to one of examples 45-50, wherein in the first bit group it is also flagged whether an error has occurred.

Example 52

The apparatus according to example 51, wherein,
when the pulse sequence is a pulse sequence sent for a zero crossing and no error has occurred, the second bit group is modulated with information indicating the strength of the magnetic field, and,
when no error has occurred and the pulse sequence is a pulse sequence sent for a further point in the magnetic field, the second bit group is modulated with phase information indicating that detected point in the magnetic field at which the pulse sequence is sent.

Example 53

The apparatus according to example 51 or 52, wherein the second bit group is modulated with an error code as information when there is an error, and the pulse sequence is a pulse sequence sent for a zero crossing, and the second bit group is modulated with the phase information when the pulse sequence is a pulse sequence sent for a further point in the magnetic field.

Example 54

The apparatus according to example 51 or 52, wherein, when there is an error, an error code is modulated onto the second bit group as information.

Example 55

An apparatus for receiving rotation speed information, comprising:
means for receiving pulse sequences, wherein each pulse sequence comprises a first pulse having a first current level, followed by a number of bit pulses coding a number of bits having a second and a third current level, wherein a first bit group of the number of bits of a respective pulse sequence indicates whether the pulse sequence is a pulse sequence sent for a detected zero crossing or a pulse sequence sent for a detected further value of a magnetic field,
means for determining a type of information modulated onto a second bit group of the number of bits of the respective pulse sequence on the basis of the first bit group, and
means for evaluating the information modulated onto the second bit group in accordance with the determined type of information.

Example 56

The apparatus according to example 55, wherein the apparatus comprises means for processing pulse sequences sent using the apparatus according to one of examples 45-54.

Example 57

The apparatus according to example 55 or 56, wherein the number of bits of each pulse sequence is nine, wherein the second bit of the number of bits indicates whether the pulse sequence is a pulse sequence sent for a zero crossing.

Example 58

The apparatus according to example 57, wherein the second bit group comprises the sixth, seventh and eighth bits of the number of bits.

Example 59

The apparatus according to one of examples 55-58, wherein the further point in the magnetic field is consistent with a threshold value being crossed by the magnetic field, with a minimum of the magnetic field and/or with a maximum of the magnetic field.

Example 60

The apparatus according to one of examples 55-59, wherein the type of information is determined as phase information indicating that further point in the magnetic field at which the pulse sequence has been sent when the first bit group indicates that the pulse sequence is a pulse sequence sent for a detected further point in the magnetic field.

Example 61

The apparatus according to one of examples 55-60, wherein the type of information is determined as information indicating a strength of the magnetic field when the first bit group indicates that the pulse sequence is a pulse sequence sent for a detected zero crossing.

Example 62

The apparatus according to one of examples 55-59, wherein the first bit group is also taken as a basis for determining whether an error has occurred.

Example 63

The apparatus according to example 62, wherein,
when the first bit group indicates that the pulse sequence is a pulse sequence sent for a zero crossing and no error has occurred, the type of information is determined as information indicating the strength of the magnetic field, and,
when the first bit group indicates that no error has occurred and that the pulse sequence is a pulse sequence sent for a detected further point in the magnetic field, the type of information is determined as phase information indicating that detected point in the magnetic field at which the pulse sequence is sent.

Example 64

The apparatus according to example 62 or 63, wherein, when the first bit group indicates that an error has occurred, the type of information is determined as an error code, and the type of information is determined as phase information when the first bit group indicates that the pulse sequence is a pulse sequence sent for a further point in the magnetic field.

Example 65

The apparatus according to example 62 or 63, wherein, when the first bit group indicates that an error has occurred, the type of information is determined as an error code.

Although specific exemplary embodiments have been illustrated and described in this description, persons having standard knowledge in the art will recognize that a multiplicity of alternative and/or equivalent implementations can be chosen as a substitute for the specific exemplary embodiments shown and described in this description without departing from the scope of the invention shown. It is the intention for this application to cover all adaptations or variations of the specific exemplary embodiments that are discussed here. It is therefore intended that this invention is restricted only by the claims and the equivalents of the claims.

The invention claimed is:

1. An apparatus for sending rotation speed information, comprising:
   a signal processor configured to receive a magnetic field sensor signal from a magnetic field sensor; and
   a current interface configured to be actuated by the signal processor to send pulse sequences of a current signal representing the rotation speed information, wherein each pulse sequence comprises a first pulse having a first current level, followed by a number of bit pulses coding a number of bits having a second and a third current level,
   wherein the signal processor is configured to detect zero crossings in a characteristic of a magnetic field and further points in the characteristic of the magnetic field on the basis of the magnetic field sensor signal, and to actuate the current interface to send a pulse sequence when a zero crossing or a further point in the magnetic field is detected, and
   wherein, in a first bit group of the number of bits of a respective pulse sequence, it is flagged whether the pulse sequence is a pulse sequence sent for a detected zero crossing or a pulse sequence sent for a detected further point, and, depending on whether it is a pulse sequence sent for a detected zero crossing or a pulse sequence sent for a detected further point, information modulated onto a second bit group of the number of bits of the respective pulse sequence is selected.

2. The apparatus as claimed in claim 1, wherein the number of bits of each pulse sequence is nine, and the second bit of the number of bits indicates whether the pulse sequence is a pulse sequence sent for a detected zero crossing.

3. The apparatus as claimed in claim 2, wherein the second bit group comprises sixth, seventh and eighth bits of the number of bits.

4. The apparatus as claimed in claim 1, wherein the further points in the magnetic field are consistent with a threshold value being crossed by the magnetic field, with a global minimum or a global maximum of the magnetic field.

5. The apparatus as claimed in claim 1, wherein the second bit group is modulated with phase information indicating that further point in the magnetic field for which the pulse sequence is sent when it is a pulse sequence sent for a detected further point.

6. The apparatus as claimed in claim 1, wherein when the pulse sequence is a pulse sequence sent for a zero crossing, the second bit group is modulated with information indicating a strength of the magnetic field.

7. The apparatus as claimed in claim 1, wherein in the first bit group it is flagged whether an error has occurred.

8. The apparatus as claimed in claim 7, wherein:
   when the pulse sequence is a pulse sequence sent for a zero crossing and no error has occurred, the second bit group is modulated with information indicating the strength of the magnetic field, and
   when no error has occurred, the pulse sequence is a pulse sequence sent for a further point in the magnetic field, and no error has occurred, the second bit group is modulated with phase information indicating that point in the magnetic field for which the pulse sequence is sent.

9. The apparatus as claimed in claim 7, wherein the second bit group is modulated with an error code as information when an error has occurred and the pulse sequence is a pulse sequence sent for a zero crossing, and the second bit group is modulated with the phase information when the pulse sequence is a pulse sequence sent for a further point in the magnetic field.

10. The apparatus as claimed in claim 8, wherein when there is an error, an error code is modulated onto the second bit group as information.

11. An apparatus for receiving rotation speed information, comprising:
a current interface configured to receive, from a sensor apparatus, pulse sequences of a current signal representing the rotation speed information, wherein each pulse sequence comprises a first pulse having a first current level, followed by a number of bit pulses coding a number of bits having a second and a third current level; and
a signal processor configured to process the received pulse sequences by using a first bit group of the number of bits of a respective pulse sequence in which it is flagged whether the pulse sequence is a pulse sequence sent for a detected zero crossing in a characteristic of a magnetic field or a pulse sequence sent for a detected further point in a characteristic of a magnetic field to determine what type of information is modulated on a second bit group of the number of bits, and evaluating the second bit group in accordance with the determined type of information.

12. A method for sending rotation speed information, comprising:
detecting, by a signal processor, zero crossings and further points in a characteristic of a magnetic field sensed by a magnetic field sensor;
sending, by a current interface actuated by the signal processor, a respective pulse sequence, which represents rotation speed information, for the detected zero crossings and the further points in the magnetic field, each pulse sequence comprising a first pulse having a first current level, followed by a number of bit pulses coding a number of bits having a second and a third current level,
wherein, in a first bit group of the number of bits of a respective pulse sequence, it is flagged whether the pulse sequence is a pulse sequence sent for a detected zero crossing or a pulse sequence sent for a detected further point, and, depending on whether the pulse sequence is a pulse sequence sent for a detected zero crossing or a pulse sequence sent for a detected further point, information modulated onto a second bit group of the number of bits is selected.

13. The method as claimed in claim 12, wherein the number of bits of each pulse sequence is nine, and the second bit of the number of bits indicates whether the pulse sequence is a pulse sequence sent for a detected zero crossing.

14. The method as claimed in claim 13, wherein the second bit group comprises sixth, seventh and eighth bits of the number of bits.

15. The method as claimed in claim 12, wherein the further points in the magnetic field are consistent with a threshold value being crossed by the magnetic field, with a global minimum or a global maximum of the magnetic field.

16. The method as claimed in claim 12, wherein the second bit group is modulated with phase information indicating that further point in the magnetic field at which the pulse sequence is sent when the pulse sequence is not a pulse sequence sent for a detected further point.

17. The method as claimed in claim 12, wherein when the pulse sequence is a pulse sequence sent for a zero crossing, the second bit group is modulated with information indicating a strength of the magnetic field.

18. The method as claimed in claim 12, wherein in the first bit group it is flagged whether an error has occurred.

19. The method as claimed in claim 18, wherein:
when the pulse sequence is a pulse sequence sent for a zero crossing and no error has occurred, the second bit group is modulated with information indicating the strength of the magnetic field, and
when no error has occurred and the pulse sequence is a pulse sequence sent for a further point in the magnetic field, the second bit group is modulated with phase information indicating that detected point in the magnetic field at which the pulse sequence is sent.

20. The method as claimed in claim 18, wherein the second bit group is modulated with an error code as information when there is an error, and the pulse sequence is a pulse sequence sent for a zero crossing, and the second bit group is modulated with the phase information when the pulse sequence is a pulse sequence sent for a further point in the magnetic field.

21. The method as claimed in claim 18, wherein when there is an error, an error code is modulated onto the second bit group as information.

22. A non-transitory computer readable carrier having a computer program with program code that, when the program code is executed by a processor, causes the method as claimed in claim 12 to be carried out.

23. A method for receiving rotation speed information, comprising:
receiving, at a current interface from a magnetic field sensor apparatus, pulse sequences representing the rotation speed information, wherein each pulse sequence comprises a first pulse having a first current level, followed by a number of bit pulses coding a number of bits having a second and a third current level, wherein a first bit group of the number of bits of a respective pulse sequence indicates whether the pulse sequence is a pulse sequence sent for a detected zero crossing or a pulse sequence sent for a detected further value of a magnetic field;
determining, by a signal processor, a type of information modulated onto a second bit group of the number of bits of the respective pulse sequence on the basis of the first bit group; and
evaluating, by the signal processor, the information modulated onto the second bit group in accordance with a determined type of information.

* * * * *